United States Patent
Goswami et al.

(10) Patent No.: US 9,720,792 B2
(45) Date of Patent: Aug. 1, 2017

(54) INFORMATION THEORETIC CACHING FOR DYNAMIC PROBLEM GENERATION IN CONSTRAINT SOLVING

(75) Inventors: Dhiraj Goswami, Wilsonville, OR (US); Ngai Ngai William Hung, San Jose, CA (US)

(73) Assignee: SYNOPSYS, INC., Mountain View, CA (US)

( * ) Notice: Subject to any disclaimer, the term of this patent is extended or adjusted under 35 U.S.C. 154(b) by 657 days.

(21) Appl. No.: 13/596,776

(22) Filed: Aug. 28, 2012

(65) Prior Publication Data
US 2014/0067356 A1    Mar. 6, 2014

(51) Int. Cl.
G06F 17/50    (2006.01)
G06F 11/263   (2006.01)

(52) U.S. Cl.
CPC ........ *G06F 11/263* (2013.01); *G06F 17/5022* (2013.01)

(58) Field of Classification Search
CPC ............. G06F 17/5022; G06F 17/505; G06F 17/5045; G06F 11/3457; G06F 17/504
USPC ................... 703/1, 2, 14; 716/100, 106, 110
See application file for complete search history.

(56) References Cited

U.S. PATENT DOCUMENTS

| | | | |
|---|---|---|---|
| 5,432,707 A | 7/1995 | Leung | |
| 5,590,049 A * | 12/1996 | Arora | 716/112 |
| 5,630,051 A | 5/1997 | Sun et al. | |
| 5,761,487 A | 6/1998 | Yuguchi | |
| 5,971,596 A | 10/1999 | Nishikawa | |
| 6,065,063 A | 5/2000 | Abali | |
| 6,212,668 B1 | 4/2001 | Tse et al. | |
| 6,219,809 B1 * | 4/2001 | Noy | 714/724 |
| 6,339,837 B1 | 1/2002 | Li | |
| 6,378,096 B1 | 4/2002 | Chakradhar et al. | |
| 6,519,727 B2 | 2/2003 | Noy | |
| 6,609,230 B1 | 8/2003 | Li | |
| 6,684,359 B2 | 1/2004 | Noy | |

(Continued)

OTHER PUBLICATIONS

Malek Mouhoub et al, "Heuristic techniques for variable and value ordering in CSPs", 2011, Proceeding GECCO '11 Proceedings of the 13th annual conference on Genetic and evolutionary computation pp. 457-464.*

(Continued)

*Primary Examiner* — David Silver
(74) *Attorney, Agent, or Firm* — Alston & Bird LLP (57) ABSTRACT

Computer-implemented techniques are disclosed for verifying circuit designs using dynamic problem generation. A device under test (DUT) is modeled as part of a test bench where the test bench is a random process. A set of constraints is solved to generate stimuli for the DUT. Problem generation is repeated numerous times throughout a verification process with problems and sub-problems being generated and solved. When a problem is solved, the problem structure can be stored in a cache. The storage can be based on entropy of variables used in the problem. The problem storage cache can be searched for previously stored problems which match a current problem. By retrieving a problem structure from cache, the computational burden is reduced during verification. Problems can be multi-phase problems with storage and retrieval of problem structures based on the phase level. Caching can be accomplished using an information theoretic approach.

36 Claims, 7 Drawing Sheets

(56) References Cited

U.S. PATENT DOCUMENTS

| | | |
|---|---|---|
| 6,792,587 B2 | 9/2004 | Xing et al. |
| 6,918,076 B2 | 7/2005 | Lagoon et al. |
| 6,920,584 B2 | 7/2005 | Phelps et al. |
| 6,993,730 B1 | 1/2006 | Higgins et al. |
| 7,003,749 B2 | 2/2006 | Subasic et al. |
| 7,107,553 B2 | 9/2006 | Lockyear et al. |
| 7,114,111 B2 | 9/2006 | Noy |
| 7,191,107 B2 | 3/2007 | Andrzejak et al. |
| 7,194,713 B2 | 3/2007 | Iwashita |
| 7,222,317 B1 | 5/2007 | Mathur et al. |
| 7,257,786 B1* | 8/2007 | Kukula .................. 716/106 |
| 7,257,808 B2 | 8/2007 | Robison |
| 7,260,562 B2 | 8/2007 | Czajkowski et al. |
| 7,266,534 B2 | 9/2007 | Emek et al. |
| 7,284,177 B2 | 10/2007 | Hollander et al. |
| 7,290,193 B2 | 10/2007 | Kadkade et al. |
| 7,292,904 B2 | 11/2007 | Denton et al. |
| 7,315,996 B2 | 1/2008 | Baumgartner et al. |
| 7,333,968 B2 | 2/2008 | Geller et al. |
| 7,343,482 B2 | 3/2008 | Biles et al. |
| 7,373,621 B1 | 5/2008 | Dastidar |
| 7,383,519 B2 | 6/2008 | Iwamura |
| 7,386,521 B2 | 6/2008 | Adir et al. |
| 7,409,377 B2 | 8/2008 | Emek et al. |
| 7,409,656 B1 | 8/2008 | Ruehl |
| 7,509,605 B2 | 3/2009 | Baumgartner et al. |
| 7,530,036 B2 | 5/2009 | Nahir et al. |
| 7,606,776 B1 | 10/2009 | Havens et al. |
| 7,613,973 B2 | 11/2009 | Lagoon et al. |
| 7,617,468 B2 | 11/2009 | Thakur et al. |
| 7,685,554 B1 | 3/2010 | Kelly et al. |
| 7,742,907 B2 | 6/2010 | Gupta et al. |
| 7,761,818 B2 | 7/2010 | Gray et al. |
| 7,779,378 B2 | 8/2010 | Baumgartner et al. |
| 7,788,616 B2 | 8/2010 | Baumgartner et al. |
| 7,793,242 B2 | 9/2010 | Baumgartner et al. |
| 7,797,123 B2 | 9/2010 | De et al. |
| 7,870,523 B1 | 1/2011 | Uziel et al. |
| 8,020,122 B2 | 9/2011 | Cheng et al. |
| 8,020,125 B1 | 9/2011 | Kuehlmann et al. |
| 8,042,086 B2 | 10/2011 | Tseng |
| 8,046,206 B1 | 10/2011 | Hood, III et al. |
| 8,065,255 B2 | 11/2011 | Colena et al. |
| 8,099,690 B2 | 1/2012 | Goswami et al. |
| 8,099,695 B1 | 1/2012 | Lehavot et al. |
| 8,099,696 B2 | 1/2012 | Lehavot et al. |
| 8,104,001 B2 | 1/2012 | Lehavot et al. |
| 8,108,745 B2 | 1/2012 | Kikta et al. |
| 8,150,787 B2 | 4/2012 | Maturana |
| 8,190,416 B2 | 5/2012 | Mead |
| 8,230,263 B2 | 7/2012 | Mukherjee et al. |
| 8,255,848 B2 | 8/2012 | Baumgartner et al. |
| 8,296,697 B2 | 10/2012 | Gal et al. |
| 8,302,062 B2 | 10/2012 | Gray et al. |
| 8,316,332 B1 | 11/2012 | Goyal et al. |
| 8,386,974 B2 | 2/2013 | Biswas et al. |
| 8,413,089 B2 | 4/2013 | Qiang et al. |
| 8,413,099 B2 | 4/2013 | Mottaez et al. |
| 2003/0115035 A1 | 6/2003 | Kulshreshtha et al. |
| 2006/0247930 A1* | 11/2006 | Iyer .......................... 704/236 |
| 2007/0005533 A1* | 1/2007 | Iyer et al. .................. 706/19 |
| 2007/0157187 A1 | 7/2007 | Cheng et al. |
| 2007/0220235 A1 | 9/2007 | Yehia et al. |
| 2007/0239969 A1 | 10/2007 | Biles et al. |
| 2008/0235640 A1 | 9/2008 | Gal et al. |
| 2009/0031259 A1 | 1/2009 | Gray et al. |
| 2009/0132975 A1 | 5/2009 | Cheng et al. |
| 2009/0204930 A1 | 8/2009 | Cohn et al. |
| 2009/0222791 A1 | 9/2009 | Togawa |
| 2009/0249004 A1 | 10/2009 | Wang et al. |
| 2009/0254874 A1 | 10/2009 | Rose |
| 2009/0281781 A1 | 11/2009 | Rose et al. |
| 2009/0319252 A1 | 12/2009 | De et al. |
| 2010/0017352 A1 | 1/2010 | Maturana |
| 2010/0121802 A1 | 5/2010 | Colena et al. |
| 2010/0191679 A1 | 7/2010 | Hung et al. |
| 2010/0218149 A1 | 8/2010 | Sasaki |
| 2010/0223266 A1 | 9/2010 | Balmin et al. |
| 2010/0275169 A1 | 10/2010 | Goswami et al. |
| 2010/0325593 A1 | 12/2010 | Zavadsky et al. |
| 2011/0067016 A1 | 3/2011 | Mizrachi et al. |
| 2011/0196642 A1 | 8/2011 | Newcomb |
| 2012/0136635 A1 | 5/2012 | Hung et al. |
| 2012/0253754 A1 | 10/2012 | Goswami et al. |
| 2012/0278675 A1 | 11/2012 | Qiang et al. |
| 2012/0317525 A1 | 12/2012 | Chapman |
| 2014/0040849 A1 | 2/2014 | Wecker |
| 2014/0068533 A1 | 3/2014 | Goswami et al. |
| 2015/0046385 A1 | 2/2015 | Shimizu et al. |

OTHER PUBLICATIONS

L. G. Jones and D. T. Blaauw, "A cache-based method for accelerating switch-level simulation," in IEEE Transactions on Computer-Aided Design of Integrated Circuits and Systems, vol. 13, No. 2, pp. 211-218, Feb. 1994.

Wikipedia Contributors, "Entropy (information theory)," Wikipedia, The Free Encyclopedia, as archived on Aug. 18, 2011, 17 pages, retrieved from https:/ /en. wikipedia.org/w/index.php ?title= Entropy (information_theory ) &oldid=4455697 44 on Mar. 7, 2016.

Hema Narasimhadevara, An information theoretic rents rule, MS Thesis, Oregon Health & Science University, 51 pages, 2004.

G. Pandurangan and W. Szpankowski, "A universal online caching algorithm based on pattern matching," Information Theory, 2005. ISIT 2005. Proceedings. International Symposium on, Adelaide, SA, 2005, pp. 1151-1155.

Kahng et al., "Timing Closure," VLSI Physical Design: From Graph Partitioning to Timing Closure, Chapter 8, ISBN 978-90-481-9591-6, 74 pages, (2011). [Part 1 of 2].

Kahng et al., "Timing Closure," VLSI Physical Design: From Graph Partitioning to Timing Closure, Chapter 8, ISBN 978-90-481-9591-6, 74 pages, (2011). [Part 2 of 2].

U.S. Appl. No. 13/766,749, Final Office Action dated Aug. 12, 2016.

U.S. Appl. No. 13/766,749, Non-Final Office Action dated Feb. 24, 2017.

U.S. Appl. No. 13/766,749, Non-Final Office Action dated Apr. 12, 2016.

* cited by examiner

```
Constraint Problem: (elaborated
problem)
variables:
    random        a, b, c;
    non-random    d, e, f;
constraints:
    a > 1;
    b == a + f;
    c < 5 + e;
                                610
```

```
Sub problem 1:
variables:
    random        a, b;
    non-random    f;
constraints:
    a > 1;
    b == a + f;
                                620
```

```
Sub problem 2:
variables:
    random        c;
    non-random    e;
constraints:
    c < 5 + e;
                                630
```

INFORMATION THEORETIC CACHING FOR DYNAMIC PROBLEM GENERATION IN CONSTRAINT SOLVING

FIELD OF INVENTION

This application relates generally to semiconductor circuits and more particularly to dynamic problem generation and caching techniques.

BACKGROUND

Designing modern electronic systems has become an increasingly difficult and expensive task. Architectural and fabrication complexities, plus high circuit densities, demand that the design process yield functionally correct hardware efficiently and at the lowest cost. Since design verification needs to determine whether the function of a proposed circuit design conforms to a specification, extensive analysis and verification are required to ensure compliance. A circuit's ability to successfully meet a specification ensures the proper operation of both the circuit in question and the system as a whole. In order to perform such verification, various simulation tools are used. Since the detailed evaluation of circuits—especially large circuits—is too difficult and time consuming to be viable, circuit designers have employed an approach to verification that maximizes coverage. For example, traditional verification methods are based on test benches. Test benches are a verification technique that functions by applying sequences of known test vectors to the circuit inputs and monitoring the results at the circuit outputs. If the expected output values are discovered, the circuit is thought to function properly. However, these approaches have become less efficient at finding design errors, both because of the increased test duration and difficulty inherent in verifying complex modern circuit designs. Further, current methods do not scale to large electronic systems comprising perhaps hundreds of millions of devices. Thus, improved verification approaches are required.

Constrained random verification is a technique used to gauge functionality of complex modern circuit arrangements. As before, this verification approach is based on a test bench. The test bench generates a random (or pseudo-random) set of test vectors which may represent a much wider range of values than possible using the fixed sequences previously employed. However, arbitrary, random values may not properly stimulate a design in situ. Thus, the random values must be constrained to encapsulate the context of the system or subsystem being tested. In order to maximize test coverage, the random values generated must represent an appropriate distribution—ideally a uniform distribution—across the solution space. The generation of stimuli for the design under test (DUT) requires repeated generation of random values in order to provide coverage throughout the possible solution space. Generating uniformly distributed, constrained stimuli across a solution space is difficult and implementing the stimuli to verify a design presents further significant challenges, including substantial runtime and memory usage inefficiencies. Thus, a test solution which improves runtime and memory efficiencies is highly desirable.

SUMMARY

Techniques implemented for the verification of integrated circuits are required to stimulate the device under test (DUT) to a sufficient extent to ensure that the device matches a design specification. Further, the verification process, which is by necessity computationally intensive, must be undertaken in such a way as to minimize test duration and computer resource utilization. A computer-implemented method for design analysis is disclosed comprising: obtaining a set of constraints for a semiconductor circuit wherein one or more constraints from the set of constraints is defined over one or more variables; modeling the semiconductor circuit as part of a test bench wherein the test bench is modeled as a random process; solving the set of constraints by generating random values for the one or more variables within the test bench; using a subset of the one or more variables to determine a structure for a first constraint problem; monitoring information content for the subset of the one or more variables; evaluating changes in the information content for the subset of the one or more variables; caching into problem storage, the first constraint problem along with the information content for the subset of the one or more variables, based on the changes in the information content; iterating to a second constraint problem with a second subset of the set of constraints and a second subset of the one or more variables; searching through the problem storage to identify a previously cached constraint problem which matches the second constraint problem; and retrieving from the problem storage a structure corresponding to the second constraint problem to be solved.

The method may further comprise using the structure which was retrieved to evaluate the second constraint problem. The one or more variables may include one or more of random variables and state variables. The test bench may include the semiconductor circuit as a device under test (DUT). The first constraint problem may be part of a larger constraint problem. The set of constraints may be used in a verification process for the semiconductor circuit. The first constraint problem may be divided into further constraint sub-problems. One of the constraint sub-problems may be cached along with corresponding random values found in the solving. The second constraint problem may include a multi-stage problem. The multi-stage problem may be solved successively. The searching through the problem storage may search through stored constraint problems with similar levels of depth as the multi-stage problem. The caching may be based on a transformation of one of the one or more variables. The transformation may include a modulo transformation. The first constraint problem and the second constraint problem may be synonymous. Structures for the first constraint problem and the second constraint problem may be synonymous. The method may further comprise elaborating based on a value used for one of the one or more variables and solving a derived problem from the second constraint problem based on the value used. The iterating may include evolving the second constraint problem based on an unchanging value for one of the one or more variables. The caching may use a partial prefix which includes a value for a key variable that was part of the solving. The caching may store constraint problems in a tree structure. Branches within the tree structure may be based on values of key variables. The caching may store most recently used constraint problems. The caching may be based on entropy evaluation of the information content. The entropy evaluation may include Shannon entropy. The set of constraints may encapsulate an environment surrounding the semiconductor circuit. The solving may include one or more of elaboration, functional decoupling, clustering and partitioning, and remodeling. The semiconductor circuit may be a device under test within the test bench. The set of constraints may be used in a timing analysis for the semiconductor circuit. The state variables may define a state for the semiconductor circuit and a state-to-state transition occurs within the test bench.

In embodiments, a computer system for design analysis may comprise: a memory which stores instructions; one or more processors coupled to the memory wherein the one or more processors are configured to: obtain a set of constraints for a semiconductor circuit wherein one or more constraints from the set of constraints is defined over one or more variables; model the semiconductor circuit as part of a test bench wherein the test bench is modeled as a random process; solve the set of constraints by generating random values for the one or more variables within the test bench; using a subset of the one or more variables to determine a structure for a first constraint problem; monitor information content for the subset of the one or more variables evaluate changes in the information content for the subset of the one or more variables; cache into problem storage, the first constraint problem along with the information content for the subset of the one or more variables, based on the changes in the information content; iterate to a second constraint problem with a second subset of the set of constraints and a second subset of the one or more variables; search through the problem storage to identify a previously cached constraint problem which matches the second constraint problem; and retrieve from the problem storage a structure corresponding to the second constraint problem to be solved. In some embodiments, a computer program product embodied in a non-transitory computer readable medium may comprise: code for obtaining a set of constraints for a semiconductor circuit wherein one or more constraints from the set of constraints is defined over one or more variables; code for modeling the semiconductor circuit as part of a test bench wherein the test bench is modeled as a random process; code for solving the set of constraints by generating random values for the one or more variables within the test bench; code for using a subset of the one or more variables to determine a structure for a first constraint problem; code for monitoring information content for the subset of the one or more variables; code for evaluating changes in the information content for the subset of the one or more variables; code for caching into problem storage, the first constraint problem along with the information content for the subset of the one or more variables, based on the changes in the information content; code for iterating to a second constraint problem with a second subset of the set of constraints and a second subset of the one or more variables; code for searching through the problem storage to identify a previously cached constraint problem which matches the second constraint problem; and code for retrieving from the problem storage a structure corresponding to the second constraint problem to be solved.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

The verification of modern electronic systems requires that a device under test (DUT) be simulated to the extent that the behavior of the DUT may be shown to match some specification of the electronic system. Since modern systems may now comprise tens or even hundreds of millions of active devices, such a verification process is a complex, computationally intensive, and time-consuming undertaking that is nonetheless critical to the design process. There have been many techniques proposed to ease the process of providing vectors necessary to test the DUT. For example, generating test vectors on-chip via a pseudo-random number generator is widely adopted. However, because of the increased device count and system complexity, the generated numbers alone may not provide sufficient test coverage to verify proper operation over the entire design space. Instead, more advanced techniques are required. Many of these techniques ensure sufficient coverage by finding viable test vectors based on the encapsulation of the environment surrounding the DUT—i.e. the context of the DUT within the system. One powerful technique which meets these verification objectives is constrained random verification. In this technique, a system designer writes a set of constraints, typically in a design language. Design information may be in the form of Verilog™, VHDL™, SystemVerilog™, SystemC™, Vera™ e™, or other design language. The test bench uses these constraints to restrict the random stimuli generated by a pseudo-random number generator or process. Thus, during simulation, a constraint solver is used to generate a random solution which satisfies the user-specified (programmed) constraints. Therefore, the verification process is comprised of repeated calls to the constraint solver in order to generate the random stimuli required for successful verification of the electronic system.

Verification of an electronic system using constrained random verification requires mapping defined constraints to a final constraint problem. Realizing that a language used for defining constraints allows for complicated semantic constructions, these constructions must be conformed to the final constraint problem in a process called "problem generation." The process of "problem generation" is repeated many times throughout the verification process. For every call by a test bench for a random vector which meets the user-defined constraints, several process steps are required. In addition, every step in the problem generation process creates problems and sub-problems which must be determined, manipulated, and stored, thus creating significant computational and storage requirements. However, some of the problems, sub-problems, or components thereof recur during the verification process. Thus the determination, manipulation, and storage of these problems is redundant if these problems are regenerated and rewritten to memory. Therefore, finding a method able to determine which problems and sub-problems are likely to be reused—a method able to locate those repeating problems using effective storage and retrieval methods—is highly desirable. Such a method would significantly reduce computational and storage requirements while significantly improving verification speed and efficiency. It should be understood that the disclosed concepts apply to other types of problem generation beyond semiconductor verification. Semiconductor timing as well as numerous other computational problems may be evaluated using these techniques.

Figure 1:
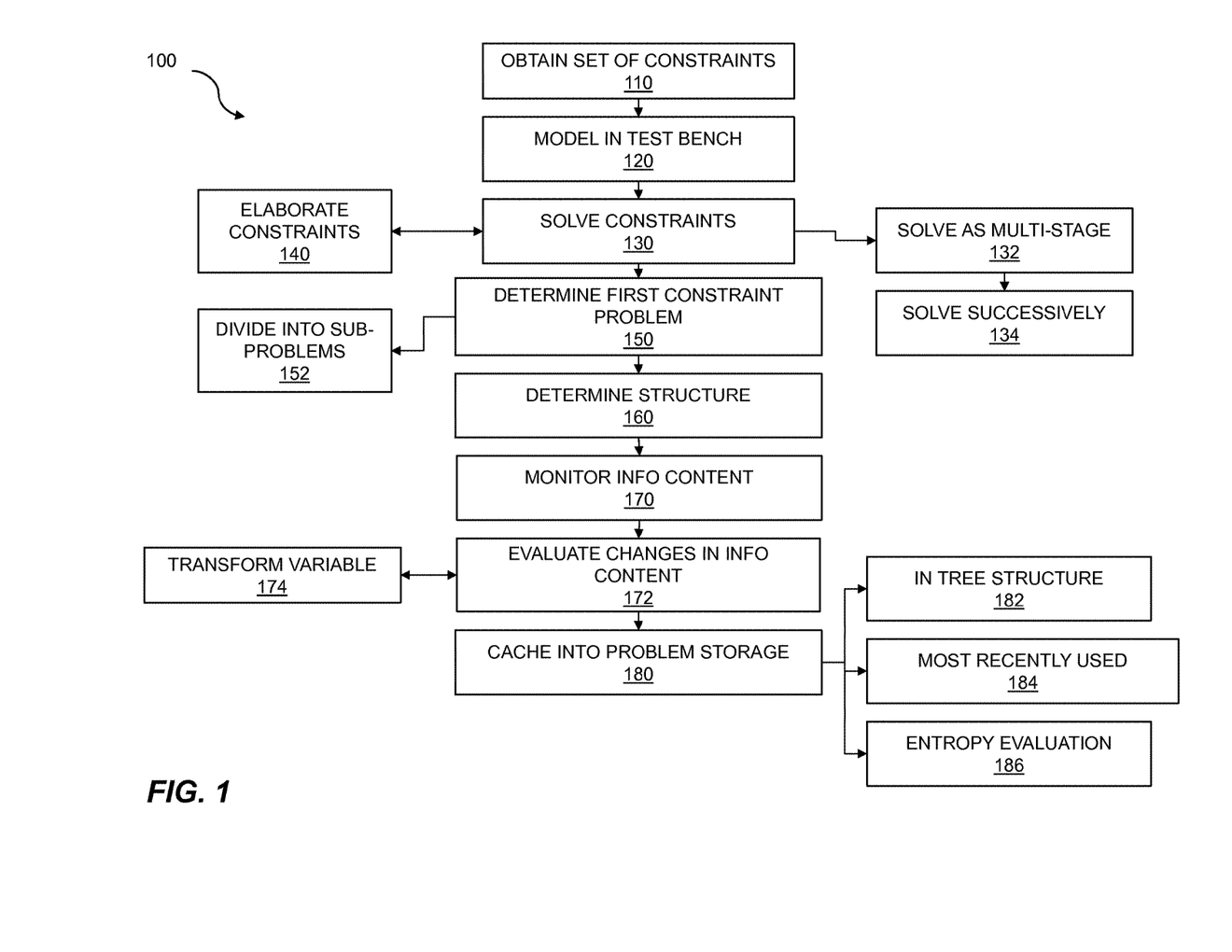
FIG. 1 is a flow diagram for problem generation.

FIG. 1 is a flow diagram for problem generation. A flow 100 is described for a computer implemented verification method using dynamic problem generation. Electronic design verification is a crucial step in the design and analysis of an electronic system. The purpose of verification is to ensure that an electronic system design matches a predetermined specification. However, since modern electronic systems are comprised of as many as tens to hundreds of millions of electronic devices, system verification has become a highly complex, time consuming, and costly venture. Random stimuli are often generated for verification purposes, but those random stimuli may not be arbitrarily random. Instead, the stimuli must encapsulate the environment surrounding—i.e. the context of—the DUT. The random values generated must both represent valid inputs to the DUT and be distributed in an appropriate manner across the design space.

User or tool generated constraints, typically written in a design language, are used to correctly randomly generate numbers in order to produce valid test vectors. That is, test stimuli are generated via a random number generator or processor and then verified by constraining them to satisfy the user-defined constraints. The process of identifying valid test stimuli is called solving of problems. Such generated problems may occur many times throughout the verification process. Each problem generation requires computational and storage resources, so a method capable of implementing problem reuse is highly desirable. Reducing computational and storage requirements while speeding verification time is critical to the successful verification of an electronic system. Thus, a verification method which significantly reduces computational and storage requirements while improving verification efficacy and speed through problem reuse is critical to successful electronic system design.

The flow 100 begins with obtaining a set of constraints 110. In embodiments, the set of constraints may be for a semiconductor circuit wherein one or more of the constraints from the set of constraints may be defined over one or more variables. The constraints as well as other design information may be written in Verilog™, VHDL™, SystemVerilog™, SystemC™, Vera™, e™, or other design language. The constraints may be generated by a design automation tool and may encapsulate an environment surrounding the semiconductor circuit. The environment may include upstream and downstream logic from a semiconductor circuit. The set of constraints may be used in a verification process for the semiconductor circuit, in a timing analysis for the semiconductor circuit, or in some other type of constraint problem. The one or more variables may include random variables and/or state variables.

The flow 100 continues with modeling in a test bench 120. A test bench model may be used for verification purposes. In embodiments, the modeling may comprise modeling the semiconductor circuit as part of a test bench model wherein the test bench is modeled as a random process. The test bench may include the semiconductor circuit as a DUT. A test bench may apply valid inputs to a DUT, and may monitor the outputs of the DUT for proper operation. The test bench may request random inputs, from a pseudorandom number generator or process, which have been validated against a set of user-defined constraints. Validation of random numbers against a set of constraints is required because the random values may not be arbitrarily random. The random numbers must encapsulate the environment surrounding the DUT, i.e. the context of the DUT within a digital system. In embodiments, the semiconductor circuit may be a device under test within the test bench. State variables may define a state for the semiconductor circuit and a state-to-state transition may occur within the test bench.

The flow 100 continues with solving the set of constraints 130 by generating random values for the one or more variables within the test bench model. Because of the rich semantics in which constraints may be expressed, constraints may be in a non-scalar form. A non-scalar form may indicate, for example, that a random array initially may be of unknown size. Because the non-scalar form is of unknown size, storage requirements may not be known a priori. Thus, conversion of a non-scalar form to a scalar form may be desirable. In embodiments, the solving of the set of constraints may use random values generated for random variables within a test bench model. In embodiments, the solving may include one or more of elaboration, functional decoupling, clustering and partitioning, and remodeling. In embodiments, the constraint problem solving may include multi-stage problems 132. Multi-stage problems may result from iterating a first problem to a second problem, a second problem to a third problem, and so on. In embodiments, the multi-stage problems may be solved successively 134.

The flow 100 continues with elaborating constraints 140. A high-level design language may support rich, descriptive semantics such as arrays, smart queues and hashes; aggregate operations; set memberships; function calls; and loops, if-the-else expressions, implications, guards, and distributions. In order to support such complex semantics, a constraint solver may be required to generate a final constraint problem. Such problem generation may comprise the elaboration of loops, sets and aggregate operations; functional decoupling of function calls; clustering and partitioning to divide large constraint problems into smaller orthogonal pieces; remodeling to transform various semantic forms into simpler constraints; and the like. In embodiments, the flow may include elaborating 140 a subset of constraints, based on a random value used for one constraint from the prior set of constraints, and solving for corresponding random variables for the subset of constraints wherein the elaborating is part of the iterating to a second constraint problem. Elaboration may include having a value used for one of the variables and then solving a derived problem from the problem based on the value used.

The flow 100 continues with determining a first constraint problem 150. The flow may include determining a first constraint problem with a subset of the set of constraints and a subset of the random variables. The flow may include determining a first constraint problem solution which includes both the first constraint problem and the random values found in the solving for the subset of the set of constraints. The first constraint problem may be part of a larger constraint problem. It should be understood that a constraint problem may be divided into a series of sub-problems 152. Each sub-problem within the series may comprise a subset of random and non-random variables, a subset of constraints, and the like. The flow may include iterating to a second constraint problem with a second subset of the set of constraints and a second subset of the random variables. Each of the first constraint problem and the second constraint problem may include multi-stage problems. A multi-stage problem may be solved successively.

The flow 100 continues determining a structure 160 for a problem. The structure may include random variables, state variables, values for some of those variables, as well as elaborated loops, and other arrangements describing a framework for a problem. In some embodiments, a subset of the one or more variables may be used to determine a structure 160 for a first constraint problem. The subset of the variables may include only state variables, only random variables, a combination of state and random variables, or in some cases all of the variables over which the set of constraints are defined. The constraint problem resulting from problem generation may be solved in a variety of manners. In embodiments, the determining a first constraint problem solution may include the first constraint. One possible approach is to solve for a random number which may satisfy some user-defined constraints and then to use that random number to solve for a non-scalar problem: for example, a random array size. This approach may continue by elaborating loops and expressions such as "for each" occurrences. The approach may then solve the elaborated problem. In embodiments, this determining may produce a first constraint problem solution which may include a first constraint problem and random values that may be found in the subset of a set of constraints.

The flow 100 continues with monitoring information content 170 for the subset of the one or more variables. The monitoring may include determining significant changes in one or more of the variables. When there is little change for a variable, this type variable and the associated problem become a good candidate for reoccurrence. In other words, this type problem will likely be seen again in the near future. Therefore the flow 100 continues with evaluating changes in the information content 172 for the subset of the one or more variables. A threshold may be set for the amount of change that would indicate like reoccurrence. In some cases, a variable is transformed 174 to simplify evaluation of information content changes.

The flow 100 continues with caching into problem storage 180. Each stage of a system verification process may produce variables and values. If a later verification problem were to solve the same constraint problem, the same variables and possible values would likely result. Therefore, a previously generated problem may be cached for reuse if the same constraint problem and the same set of parameters may result from subsequent problem generation. In embodiments, the caching may include storing the first constraint problem along with the information content for the subset of the one or more variables, based on the changes in the information content. One of the constraint sub-problems may be cached along with corresponding random values found in the solving. Various caching schemes may be implemented for the caching. Numerous caching schemes exist including but not limited to Least Recently Used (LRU), Most Recently Used (MRU), Random Replacement (RR), their variants, and the like. In other embodiments, other caching schemes may be implemented such as entropy-based caching. This entropy-based caching may include, but is not limited to, Shannon entropy. The caching may be based on a transformation of one of the variables. The transformation may include a modulo transformation. Thus, rather than have $2^{32}$ possible values for a variable only 32 possible values are considered after the transformation, in one example.

Throughout the verification process, numerous simulation problems comprising a plurality of parameters may be generated. Because of numerous steps in the verification process, particular simulation problems and their requisite parameters may be generated repeatedly. Therefore, caching of previously generated problems and parameters may reduce computational overhead and storage requirements by enabling problem reuse by the verification process. A cache may comprise a datum (i.e. a problem or a parameter) and a tag which may identify the datum. An index may be implemented to enable efficient access to the cache. A variety of caching schemes may be based on, for example, a variety of writing, storage, and search policies, and may be implemented for the purposes of storing previously generated problems and parameters. The problem and parameter reuse purpose may be accomplished by any caching scheme which enables efficient storage and retrieval of previously generated problems and parameters. In embodiments, common caching schemes may be used to store and retrieve previously generated problems and parameters. The caching 180 may use a partial prefix which includes a value for a key variable that was part of the solving. Thus, a key variable may provide an index into a cache. Storage of problems and parameters in a cache may be accomplished by a variety of means. For example, data may be stored as a list or in a variety of other structures. In embodiments, the caching may store constraint problems in a tree structure 182, accessible via an index. A cache structure which improves efficiency of storage and retrieval of problems and parameters is desirable. The various elements stored on the cache (i.e. the problems and parameters) may themselves be used to improve the caching. For example, branches within the tree structure may be based on the values of key variables. In embodiments, the caching may store the most recently used constraint problems 184 in a problem cache. Other more efficient caching schemes may be implemented. In embodiments, the caching may be based on an information-theoretic parameter. Information-theoretic parameters may provide more efficient problem and parameter storage and retrieval. Information-theoretic parameters may determine whether a problem or parameter is more or less likely to change, be used again, and the like. In embodiments, the caching may be based on an entropy evaluation 186 as alluded to earlier. Entropy evaluations may be performed on problems, parameters, or a combination thereof. The degree of entropy (i.e. the amount of change) may be used to determine which problems and parameters remain in a cache for potential future use, and which problems and parameters may be flushed from the cache. Entropy evaluations may be determined by a variety of techniques which may determine, for example, the uncertainty of a random variable. In embodiments, the entropy evaluation 186 may be based on changes in the random values of the random variables 186. The degree to which a random variable changes or plurality of variables change may determine whether a problem or parameter is likely to be reused again in the verification process. A threshold of change may be set for a problem or parameter to help determine whether to maintain a problem or parameter in a cache or to flush a problem or parameter from a cache. In embodiments, the entropy evaluation 186 may include Shannon entropy. In other embodiments, other entropy evaluation techniques may be implemented. Various steps in the flow 100 may be changed in order, repeated, omitted, or the like without departing from the disclosed inventive concepts. Various embodiments of the flow 100 may be included in a computer program product embodied in a non-transitory computer readable medium that includes code executable by one or more processors.

Figure 2:
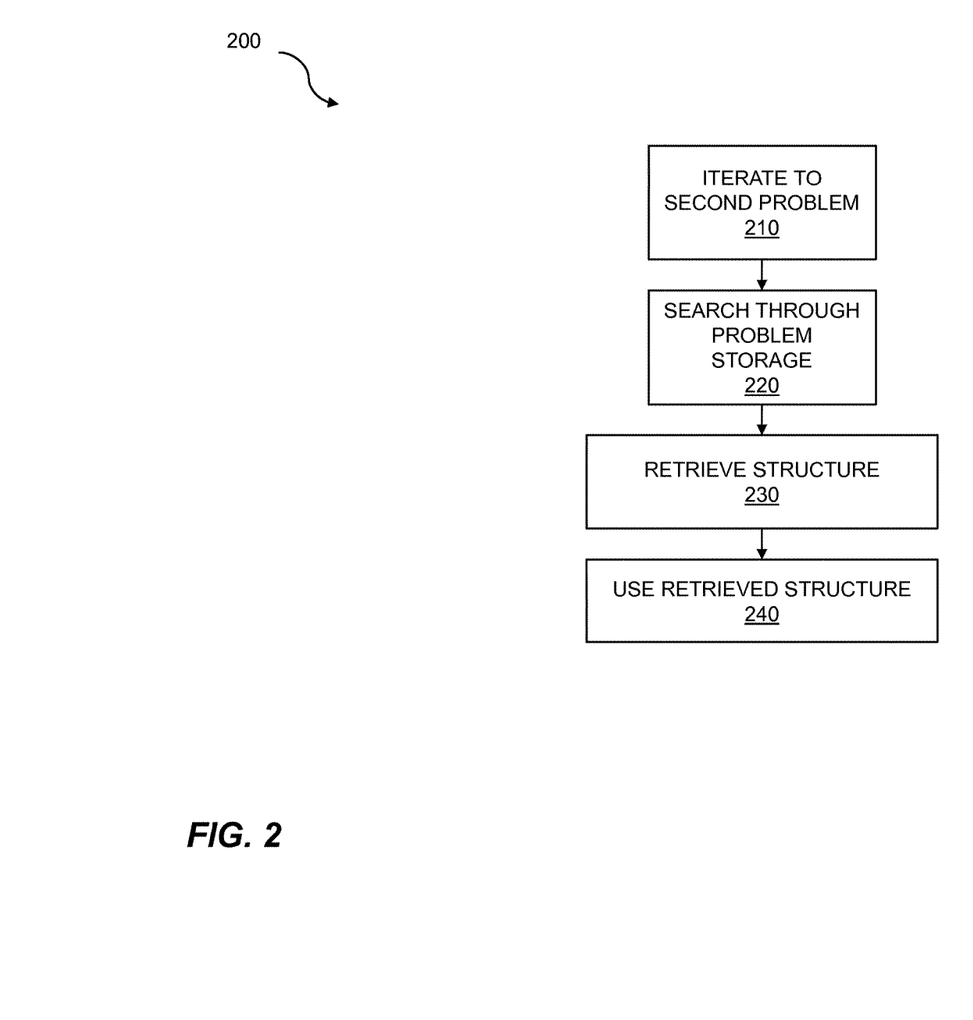
FIG. 2 is a flow diagram for cache usage.

FIG. 2 is a flow diagram for cache usage. A flow 200 may continue from flow 100. In some embodiments, the flow 200 may stand on its own and work from a pre-existing cache to determine a solution to a second problem. The flow 200 may include iterating to a second problem 210. The iterating may result from the solving of previous problems or may result from the solving of a present problem. In embodiments, the iterating may comprise iterating to a second constraint problem with a second subset of a set of constraints and a second subset of the one or more variables. In embodiments, the first constraint problem and the second constraint problem may be synonymous. Being synonymous may mean that the problems have the same structure or may mean that they are identical. In other embodiments, the first constraint problem and the second constraint problem may be different. If the first constraint problem and the second constraint problem are the same, then the results of solving the first problem may be reused thus reducing overall computation. The structures to the first constraint problem and the second constraint problem may be synonymous, meaning that they have the same constraints, variables, elaborated loops, or other characteristics. In embodiments, the iterating may include evolving the second constraint problem based on an unchanging value for one of the variables.

The flow 200 may continue with searching through problem storage 220. A successful search of problem storage may result in reduced computation if a previously solved problem which was stored may be reused. A search may be efficiently accomplished to quickly determine whether a problem was previously cached. In embodiments, the searching may comprise searching through the problem storage to identify a previously cached constraint problem, which may match the second constraint problem. As discussed previously, various caching methods may be implemented that may include but are not limited to LRU, MRU, RR, and entropy-based caching. The searching through the problem storage may search through stored constraint problems with similar levels of depth from the multi-stage problems. In many cases a second level problem structure will be identified during searching for a similar second level problem, for instance.

The flow 200 may continue with retrieving a problem structure 230 from problem storage for the second constraint problem. The retrieving may include obtaining from the problem storage a structure corresponding to the second constraint problem to be solved. In embodiments, the solutions to the first constraint problem and the second constraint problem may be the same. The flow 200 may continue with using the structure which was retrieved 240 to evaluate the second constraint problem. The random variables, state variables, values for some of those variables, as well as elaborated loops, or other arrangements describing a framework for a problem may be used to analyze the DUT. The flow may include performing solving on the second constraint problem if a comparable, previously-solved problem is not located in problem storage. Various steps in the flow 200 may be changed in order, repeated, omitted, or the like without departing from the disclosed inventive concepts. Various embodiments of the flow 200 may be included in a computer program product embodied in a non-transitory computer readable medium that includes code executable by one or more processors.

Figure 3:
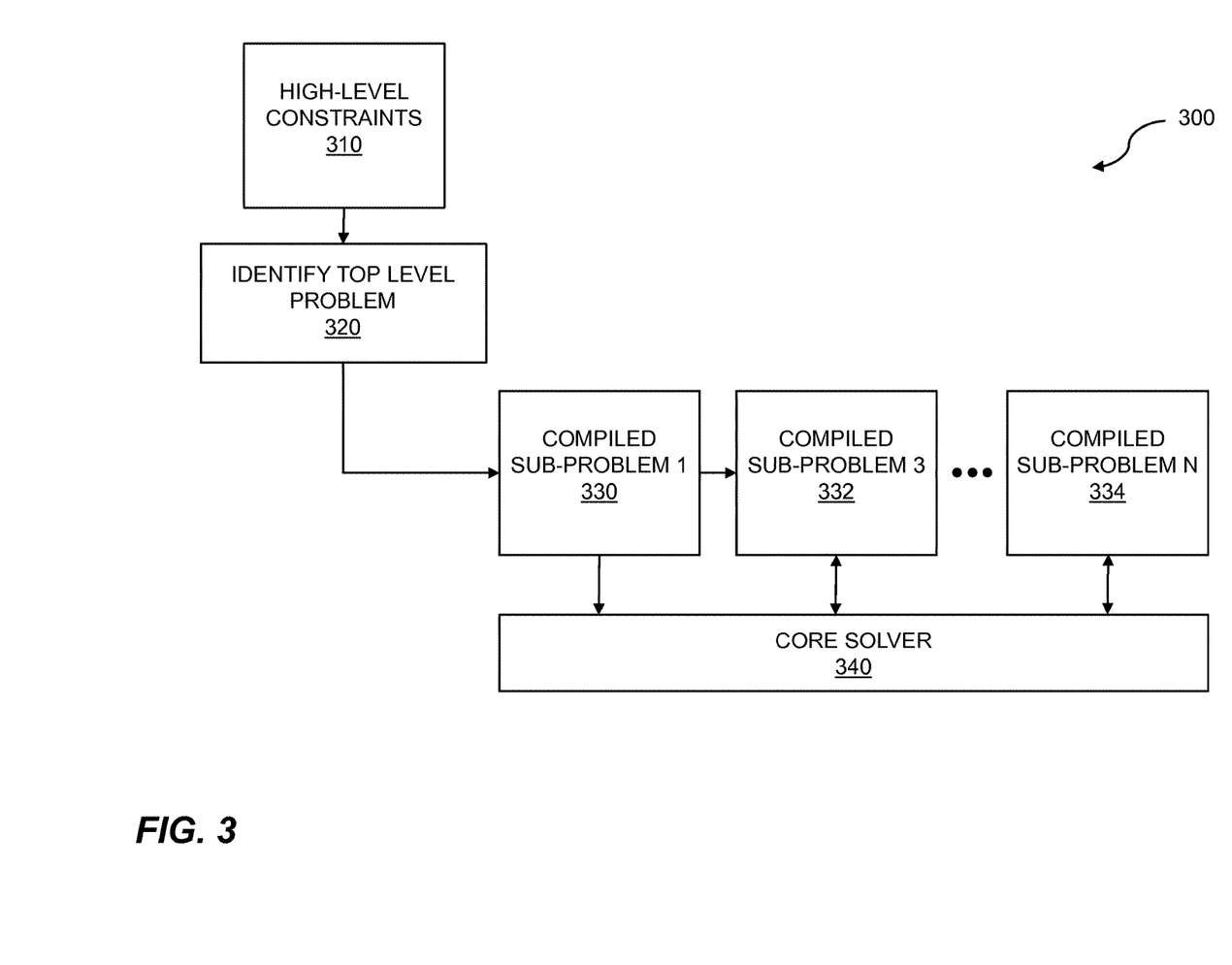
FIG. 3 is a diagram showing sub-problem generation.

FIG. 3 is a diagram showing sub-problem generation 300. A technician may use a design language, for example, to specify high-level constraints 310. In embodiments, high-level constraints may be written in the form of Verilog™, VHDL™, SystemVerilog™, SystemC™, Vera™, e™, or other design language. In embodiments, a design automation tool may generate the constraints. The constraints may express complex mathematical or logical concepts. In embodiments, the constraints may be constructed from arrays, smart queues, or hashes. The constraints may be represented by aggregate operations. In addition, the constraints may comprise set memberships, function calls, loops, "if-then-else" constructs, implications, guards, distributions, and the like. The constraints may be used to direct the simulation and verification processes. A top-level problem may be identified 320. A random value which satisfies the specified constraints may be generated by a pseudo-random number generator. The top-level constraint problem 320 may be divided into further constraint sub-problems. The constraint solver may perform a series of tasks including but not limited to: elaboration of loops, sets, aggregate operations, and the like; functional decoupling of function calls; clustering and partitioning to divide a large constraint problem into smaller, orthogonal pieces of constraint problems; and remodeling to transform various semantic constructs into simpler constraints. This approach may be thought of as a multistage dynamic process. At each stage, problem generation may be performed to create sub-problems. For example, the sub-problems generated may include Compiled Sub-problem 1 330, Compiled Sub-problem 2 332, through Compiled Sub-problem N 334. Solutions may be found for each of the generated problems and sub-problems. A core solver 340 may be called repeatedly throughout the process. During simulation, the constraint solver may find random solutions which may satisfy specified constraints. The test bench may use the constraint solver results to drive a simulation. In order for a simulation to advance, a constraint solver may be called repeatedly to generate random stimuli for the simulation process.

Figure 4:
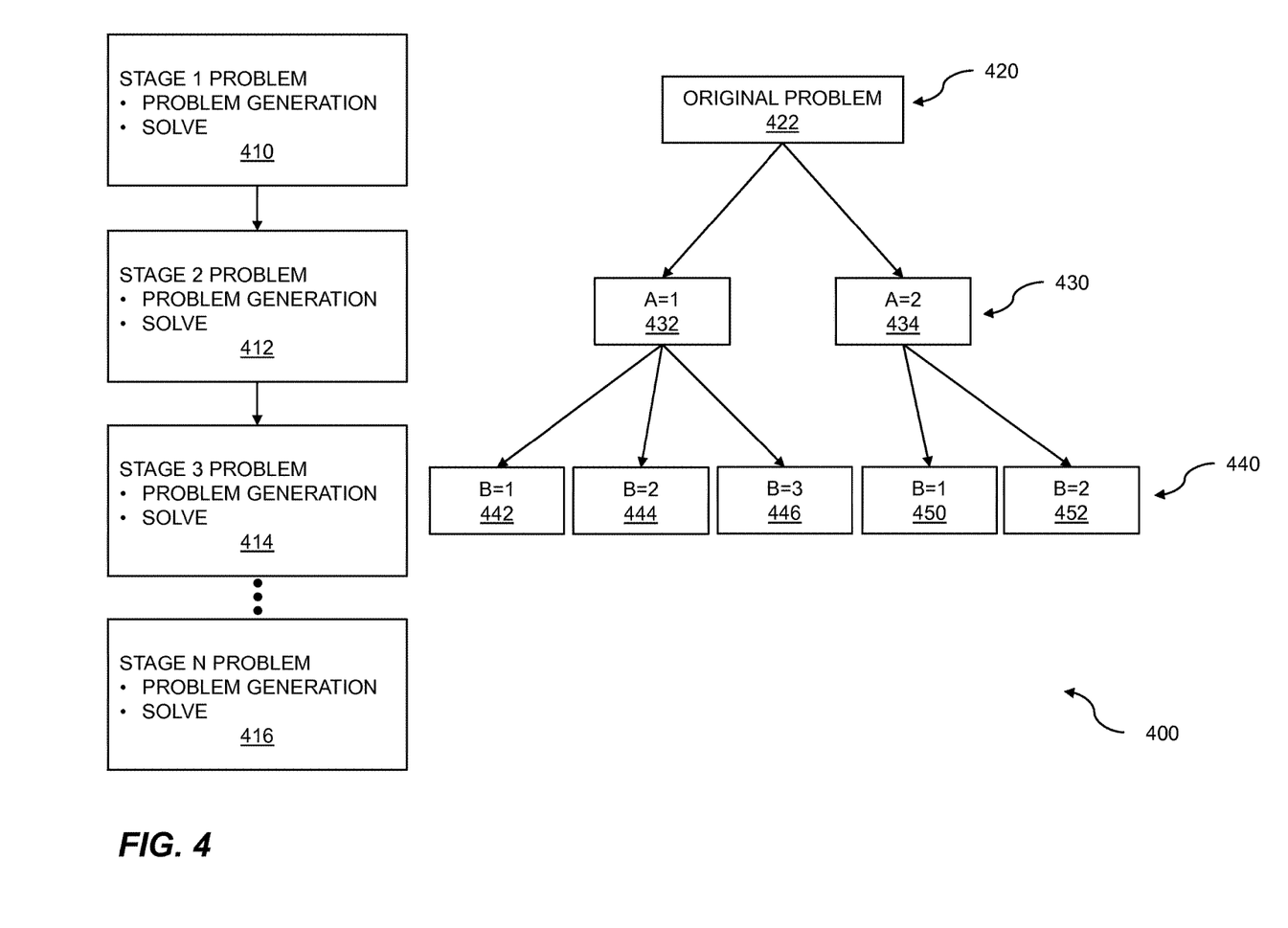
FIG. 4 is a diagram showing multistage caching.

FIG. 4 is a diagram showing multistage caching 400. A test bench may be created and may verify the operation of a DUT. A test bench may be written in a design language as part of a verification process. The test bench may comprise random values and constraints. A test bench may generate valid random values which may comply with constraints. The test bench may use these valid random values as inputs to a DUT while the outputs of the DUT may be monitored. In embodiments, constraints may be described using Verilog™, VHDL™, SystemVerilog™, SystemC™, Vera™, e™, or other design language.

In order for the verification of a DUT to proceed, the high-level code may require elaboration. The process of elaboration may include converting non-scalar variables to scalar ones. Also, high-level expressions such as arrays, smart queues, hashes, aggregate operators, set membership, function calls, loops, if-then-else constructs, implications, guards and distributions may require elaboration. In embodiments, this elaboration may comprise identifying a random number which may satisfy user constraints. Thus, a high level problem may be generated. Verification may comprise solving several problems at several stages of the process; for example: Stage 1 Problem 410, Stage 2 Problem 412, Stage 3 Problem 414, and so on to Stage N problem 416. At each stage of problem generation, there may be an elaborated high-level problem based on values which may satisfy constraints. The problems that may be generated may comprise random values generated by a pseudo-random number generator, process, or the like. The problems may then be solved for a given stage; for example: Stage 1 Problem 410, Stage 2 Problem 412, and so on. The results of the solutions of problems that may be generated at each stage may comprise variables and values. The variables and values may be cached. In embodiments, the method may include elaborating a subset of constraints, based on a random value used for one constraint from the set of constraints, and corresponding random variables for the subset of constraints wherein the elaborating may be part of the iterating to a second constraint problem.

Variables and values which may be generated at each problem solution stage may be cached. In embodiments, a cache may be a multistage cache which may be based on problem stages. For example, a cache may resemble a tree-like structure which may comprise three stages. The tree-like structure for a cache may comprise three stages, Stage 1 420, Stage 2 430, and Stage 3 440. The overall cache may be viewed as a hierarchical tree-like structure, where the original problem 422 sits at the root of the tree, or Stage 1 420, then may branch out to Stage 2 430, then Stage 3 440, and so on. Access into the tree-like structure of the cache may be based on an index. Depending on the value of some key variable, which may comprise an index, the tree progresses to various child nodes of Stage 2 430, then of Stage 3 440, and so on. An example of using a cache to store variables and values may progress as follows: an original problem 422 may correspond to a stage in solving a problem, e.g. Stage 1 Problem 410. As a result of solving various problems that may be generated for Stage 1 Problem 410, a value may be generated for a key variable such as random array size, random variable value, and the like. If, for example, the value generated by 410 is A=1, then the test bench would progress to A=1 432 in Stage 2 430. Alternatively, if the value generated by 410 is A=2, then the test bench would progress to A=2 434 in Stage 2 430. The results of the Stage 2 Problem solution may permit further access into a cache in a similar manner. For example, if the result of Stage 2 problem solution A=1 432 is B=1, then access to the cache would continue in Stage 3 440 to B=1 442; if B=2, then Stage 3 440 access would continue to B=2 444; if B=3, then Stage 3 440 access would continue to B=3 446. If the result of Stage 2 problem solution A=2 434 is B=1, then access to the cache would continue in Stage 3 440 to B=1 450; if B=2, then access to the cache would continue in Stage 3 440 to B=2 452, and so on. Subsequent problem stages may enable further access down the cache tree at increasing depth. Various caching schemes and other caching structures may be used. A problem structure may be stored based on a stage of the problem generation. Then, in turn, a problem structure may be retrieved based on the stage at which that problem was generated. For instance, a stage 3 440 problem may be generated and solved, with the resulting structure being cached. Later, a stage 3 problem may be encountered and problem storage may be searched for a corresponding problem. A stage 3 problem structure may be found and retrieved from problem storage.

Figure 5:
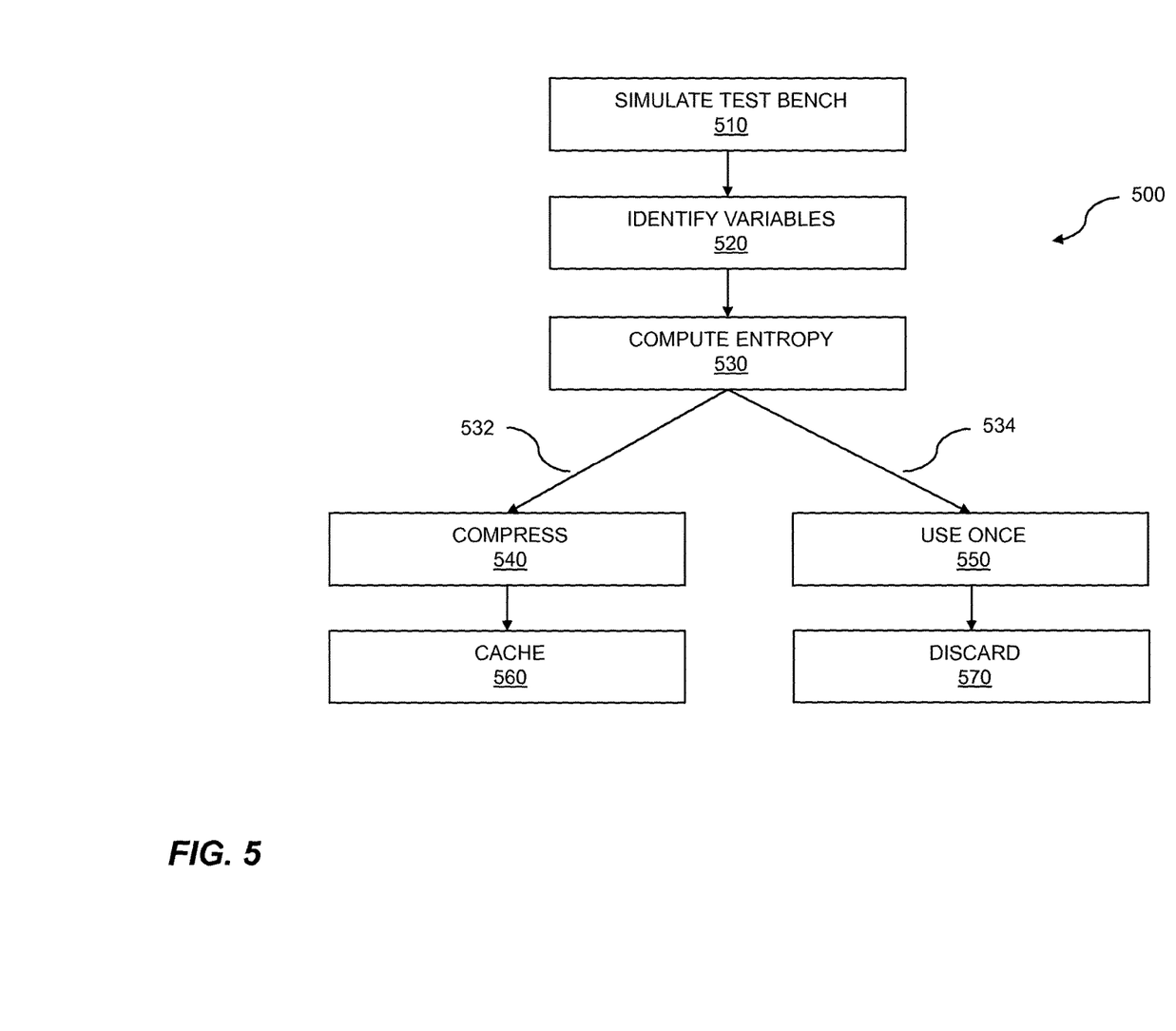
FIG. 5 is a diagram showing caching of a simulation problem.

FIG. 5 is a diagram showing caching of a simulation problem. A flow 500 describes simulation and caching. A test bench may be simulated 510 and may be part of a verification process for an electronic system. Caching frequently encountered simulation problems may be highly desirable in order to conserve computational and storage resources. The cached problem may be a high-level elaborated problem for which a constraint solver has identified a valid random value. As noted above, the constraint solver may go through a process of converting high-level constraints to a constraint problem through "problem generation." As further noted, high-level constraints are converted to constraint problems by elaboration of loops, sets, and aggregate operations. For example, functional decoupling, clustering, and partitioning may be used to divide large constraint problems into smaller, orthogonal pieces, and remodeling may be used to transform various semantic constraints into simpler constraints. As a result, a progression of problems may require solutions.

The results of a simulation 510 may be examined to identify key variables 520 which may be critical to a particular problem or a plurality of problems. Identification of key variables and values may assist in determining whether a particular problem has been solved and cached previously, or whether it may be cached at a given stage in the simulation process. Continuing, a value for entropy may be computed 530. The computed value for entropy 530 may assist in determining whether key variables are changing, and if so, by how much. In embodiments, caching may be based on entropy evaluation of the information. The entropy evaluation may include Shannon entropy. Based on entropy values, a determination may be made whether to cache key variables and values for additional (i.e. future) use. For example, in the event that key variables identified may have low entropy 532 and are therefore not changing much, and if those variables meet other caching criteria—such as a relatively high frequency of occurrence—then the variables and values may be cached for later use. Variables with low entropy 532 that meet other caching criteria may be compressed 540. In embodiments, the compression may be based on a state-to-state transformation. In embodiments, the compression 540 may result in orders of magnitude reduction in cardinality of an indexing function. After compression 540, variables and values of interest may be cached 560 for future use. In embodiments, caching may be based on a prefix. If key variables identified have high entropy 534 and are therefore changing frequently and may occur with relatively low frequency, then the variables and values may not be cached for future use. For example, the variables may be used once 550 and may then be discarded 570.

Figure 6:
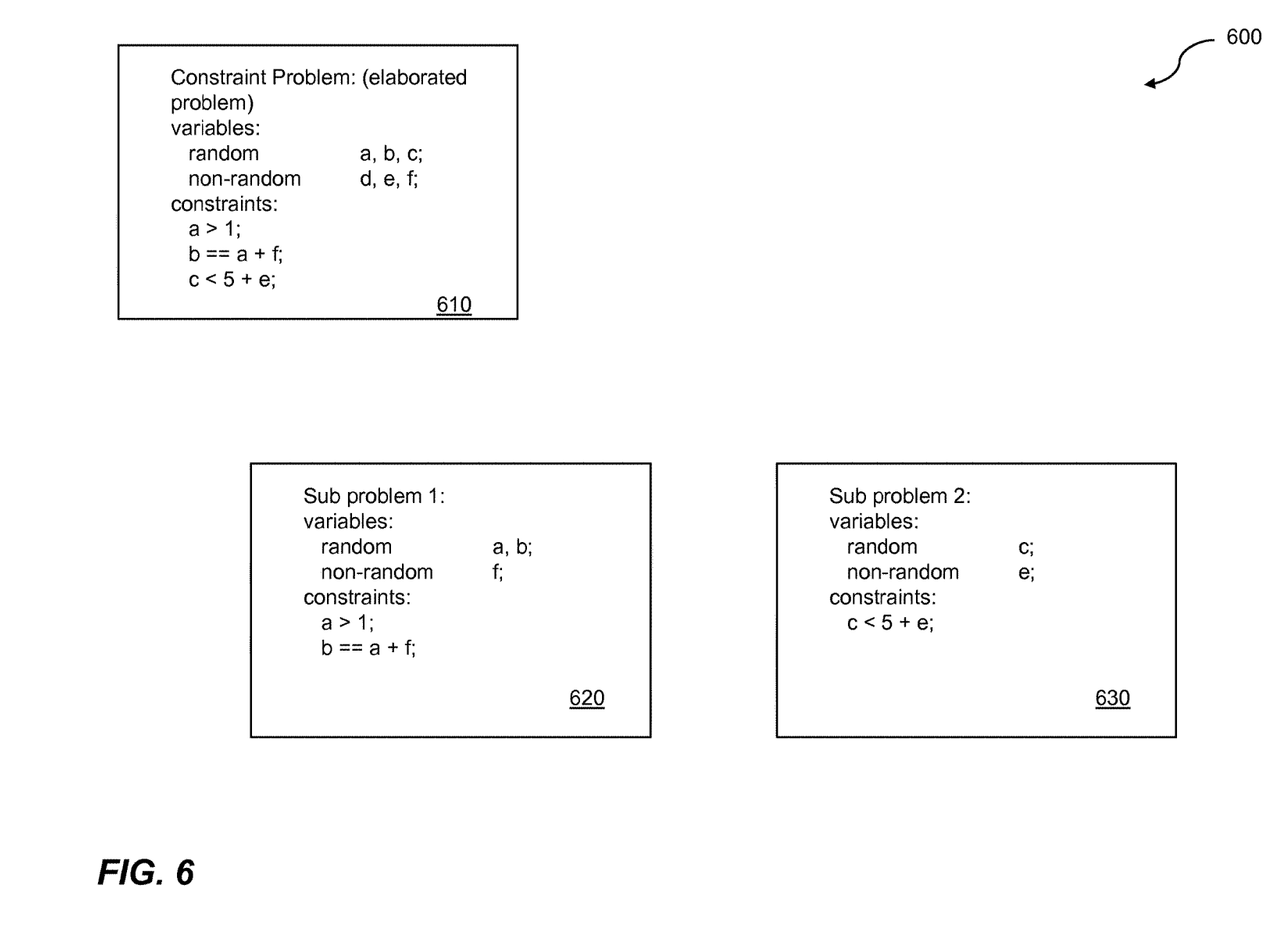
FIG. 6 is a diagram of an example constraint problem.

FIG. 6 is a diagram of an example constraint problem 600. As part of the verification process, a test bench may be generated to verify a DUT. The test bench may request random values which may meet certain constraints. The constraints may encapsulate the environment surrounding the DUT—i.e. the context of the DUT within a digital system. In embodiments, constraints may be described using Verilog™, VHDL™, SystemVerilog™, SystemC™, Vera™, e™, or other design language. In embodiments, constraints may be generated by a design automation system. The random values generated may be used as inputs to the DUT while the outputs of the DUT may be monitored. The random values generated by, for example, a pseudo-random generator or process, may satisfy the constraints, and may represent a reasonable and desirable distribution across a design space. In embodiments, the distribution across the design space may be a uniform distribution.

An example test bench may be represented by the following lines of code:

```
module test bench ( )
begin
class C
    rand integer a, b, c;
    constraint C { a > 1; b == a + c; c < 5; }
endclass
C obj = new;
while (1)
obj.randomize( );
design input.a = obj.a;
design input.b = obj.b;
...
next clock;
end
```

In the example test bench, a class C is shown which may describe random variables and constraints. These variables and constraints may be used throughout the verification process. The test bench code may then go on to describe how random values which meet the constraint requirements may be generated for the random variables, and how those random variables may be used for the verification process.

In order for the verification process to proceed, the test bench code of the example may be elaborated to form a high-level problem, may be divided into sub-problems, and may be solved. In embodiments, the test bench may comprise scalar problems in which every variable is of defined size, for example, a bit vector. In embodiments, the test bench may comprise non-scalar problems in which variables may be of random size—for example, random arrays. In order to execute the test bench, non-scalar portions of the test bench may be converted to scalar versions. For example, if there were a random array defined, such as random arr[ ], then, for a given set of constraints, a valid size for the array may be found. Subsequently, that number of instances of the array may be elaborated. For example, if an array size of 7 were found to satisfy user-defined constraints, then the random array arr[ ] may be elaborated such as random array arr[0], arr[1], . . . arr[6] for the 7 random arrays. Returning to the test bench example, we may find that after elaboration, our constraint problem may be represented by code segment 610. An elaborated version of the constraint problem 610 may then be divided into sub-problems. In embodiments, the elaborated constraint problem 610 may be divided into a first sub-problem 620 and a second sub-problem 630. In embodiments, various high-level elaborated constraint problems may be generated given a valid random number which may meet constraints, and various sub-problems may be generated for verification purposes. The structures for the sub-problems may be stored for future use in a problem storage cache. The storage may be based on information theoretic techniques.

Figure 7:
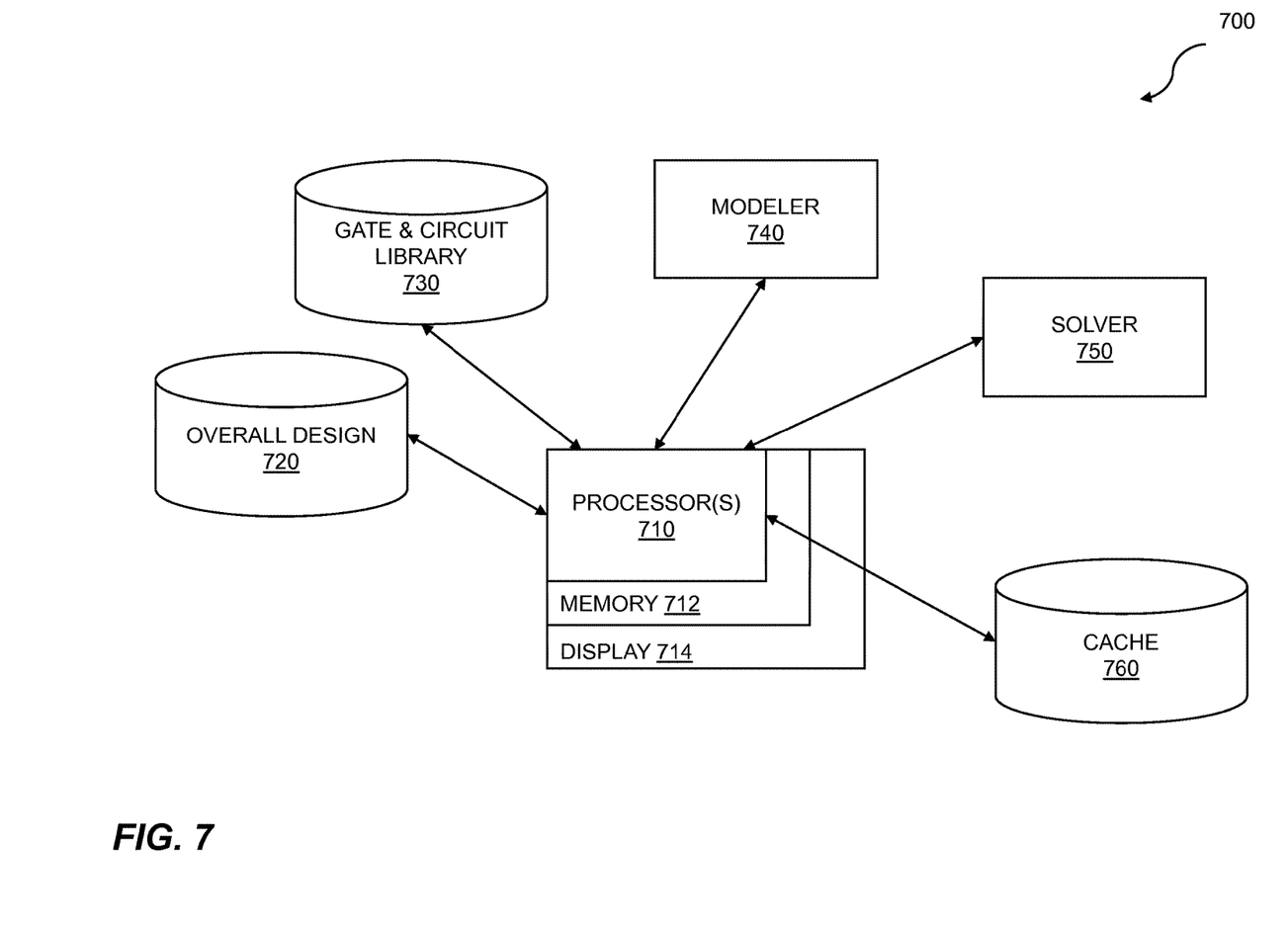
FIG. 7 is a system diagram for constraint solving with problem caching.

FIG. 7 is a system diagram for constraint solving with problem caching. In embodiments, a computer system 700 for design analysis may comprise one or more processors 710, an overall design 720, a gate and circuit library 730, a modeler 740, a solver, 750, and a cache 760. In at least one embodiment, the one or more processors 710 may accomplish the modeler and solver functions. The one or more processors may be coupled to memory 712 which stores instructions, system support data, intermediate data, analysis, help information, and the like. The one or more processors 710 may be coupled to an electronic display 714. The electronic display 714 may be any electronic display, including but not limited to, a computer display, a laptop screen, a net-book screen, a tablet computer screen, a cell phone display, a mobile device display, a remote with a display, a television, a projector, or the like.

The one or more processors 710 may load information on the overall design 720. The overall design information may contain various types of information about the electronic system which may be designed, including an architectural description of the design. Design information may be in the form of Verilog™, VHDL™, SystemVerilog™, SystemC™, Vera™, e™, or other design language. The one or more processors 710 may load gate and circuit library 730 information. In embodiments, the gate and circuit library 730 information may contain information about various gates and cells, alternative implementations of gates and cells, alternative representations of gates and cells, and the like. The gate and circuit library may contain gates and cells which may be designed for specific applications or may be provided by a customer.

A modeler 740 may be coupled to the one or more processors 710. The modeler 740 may determine a model that may be applied to a given electronic system. In embodiments, the modeler may determine a test bench model. In embodiments, the test bench may comprise random variables, and constraints that may be applied to the random variables for verification purposes.

A solver 750 may be coupled to the one or more processors 710. The solver 750 may solve for random variables which meet various constraints. In embodiments, the solver may convert non-scalar aspects of the model to scalar ones. In embodiments, the solver may determine a value for an array size. In embodiments, the solver may assign values to random variables while satisfying constraints. In embodiments, the solver may solve for multiple evolutions steps. Elaboration may be performed on various loop structures as part of the solving process. The computer system for design analysis 700 may comprise computer program product comprising: code for obtaining a set of constraints for a semiconductor circuit wherein one or more constraints from the set of constraints is defined over one or more variables; code for modeling the semiconductor circuit as part of a test bench model wherein the test bench is modeled as a random process; code for solving the set of constraints by generating random values for the one or more variables within the test bench model; code for using a subset of the one or more variables to determine a structure for a first constraint problem; code for monitoring information content for the subset of the one or more variables; code for evaluating changes in the information content for the subset of the one or more variables; code for caching into problem storage, the first constraint problem along with the information content for the subset of the one or more variables, based on the evaluating of the changes in the information content; code for iterating to a second constraint problem with a second subset of the set of constraints and a second subset of the one or more variables; code for searching through the problem storage to identify a previously cached constraint problem which matches the second constraint problem; code for retrieving from the problem storage a structure corresponding to the second constraint problem to be solved.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"— may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for design analysis comprising:
    modeling a semiconductor circuit, using a set of constraints for the semiconductor circuit wherein one or more constraints from the set of constraints is defined over one or more variables, as part of a test bench wherein the test bench is modeled as a random process;
    solving, using one or more processors, the set of constraints by generating random values for the one or more variables within the test bench to provide stimulus to the semiconductor circuit;
    using a subset of the one or more variables to determine a structure for a first constraint problem related to the semiconductor circuit;
    monitoring information content for the subset of the one or more variables related to the semiconductor circuit;
    evaluating changes in the information content for the subset of the one or more variables related to the semiconductor circuit;
    caching into problem storage, the first constraint problem along with the information content for the subset of the one or more variables related to the semiconductor circuit, based on the changes in the information content;
    iterating to a second constraint problem with a second subset of the set of constraints and a second subset of the one or more variables related to the semiconductor circuit;
    searching through the problem storage to identify a previously cached constraint problem which matches the second constraint problem related to the semiconductor circuit;
    retrieving from the problem storage a structure corresponding to the second constraint problem to be solved related to the semiconductor circuit;

solving the second constraint problem related to the semiconductor circuit based on the structure that was retrieved; and generating a stimulus for the semiconductor circuit based on the solving of the second constraint problem.

2. The method of claim 1 further comprising using the structure which was retrieved to evaluate the second constraint problem.

3. The method of claim 1 wherein the one or more variables include one or more of random variables and state variables.

4. The method of claim 1 wherein the test bench includes the semiconductor circuit as a device under test (DUT).

5. The method of claim 1 wherein the first constraint problem is part of a larger constraint problem.

6. The method of claim 1 wherein the set of constraints are used in a verification process for the semiconductor circuit.

7. The method of claim 1 wherein the first constraint problem is divided into further constraint sub-problems.

8. The method of claim 7 wherein one of the constraint sub-problems is cached along with corresponding random values found in the solving.

9. The method of claim 1 wherein the second constraint problem includes a multi-stage problem.

10. The method of claim 9 wherein the multi-stage problem is solved successively.

11. The method of claim 9 wherein the searching through the problem storage searches through stored constraint problems with similar levels of depth as the multi-stage problem.

12. The method of claim 1 wherein the caching is based on a transformation of one of the one or more variables.

13. The method of claim 12 wherein the transformation includes a modulo transformation.

14. The method of claim 1 wherein the first constraint problem and the second constraint problem are synonymous.

15. The method of claim 14 wherein structures for the first constraint problem and the second constraint problem are synonymous.

16. The method of claim 1 further comprising elaborating based on a value used for one of the one or more variables and solving a derived problem from the second constraint problem based on the value used.

17. The method of claim 1 wherein the iterating includes evolving the second constraint problem based on an unchanging value for one of the one or more variables.

18. The method of claim 1 wherein the caching uses a partial prefix which includes a value for a key variable that was part of the solving.

19. The method of claim 1 wherein the caching stores constraint problems in a tree structure.

20. The method of claim 19 wherein branches within the tree structure are based on values of key variables.

21. The method of claim 1 wherein the caching stores most recently used constraint problems.

22. The method of claim 1 wherein the caching is based on entropy evaluation of the information content.

23. The method of claim 22 wherein the entropy evaluation includes Shannon entropy.

24. The method of claim 1 wherein the set of constraints encapsulate an environment surrounding the semiconductor circuit.

25. The method of claim 1 wherein the solving includes one or more of elaboration, functional decoupling, clustering and partitioning, and remodeling.

26. The method of claim 1 wherein the semiconductor circuit is a device under test within the test bench.

27. The method of claim 1 wherein the set of constraints are used in a timing analysis for the semiconductor circuit.

28. The method of claim 3 wherein the state variables define a state for the semiconductor circuit and a state-to-state transition occurs within the test bench.

29. A computer program product embodied in a non-transitory computer readable medium, which when executed by a processor, causes the processor to perform design analysis upon receiving a design, the computer program product comprising instructions that when executed cause the processor to:

model a semiconductor circuit, using a set of constraints for a semiconductor circuit wherein one or more constraints from the set of constraints is defined over one or more variables, as part of a test bench wherein the test bench is modeled as a random process;

solve the set of constraints by generating random values for the one or more variables within the test bench to provide stimulus to the semiconductor circuit;

use a subset of the one or more variables to determine a structure for a first constraint problem related to the semiconductor circuit;

monitor information content for the subset of the one or more variables related to the semiconductor circuit;

evaluate changes in the information content for the subset of the one or more variables related to the semiconductor circuit;

cache into problem storage, the first constraint problem along with the information content for the subset of the one or more variables related to the semiconductor circuit, based on the changes in the information content;

iterate to a second constraint problem with a second subset of the set of constraints and a second subset of the one or more variables related to the semiconductor circuit;

search through the problem storage to identify a previously cached constraint problem which matches the second constraint problem related to the semiconductor circuit;

retrieve from the problem storage a structure corresponding to the second constraint problem to be solved related to the semiconductor circuit;

solve the second constraint problem related to the semiconductor circuit based on the structure that was retrieved; and generate a stimulus for the semiconductor circuit based on the solving of the second constraint problem.

30. The computer program product of claim 29 that further causes the processor to use the structure which was retrieved to evaluate the second constraint problem.

31. The computer program product of claim 29 that further causes the processor to elaborate based on a value used for one of the one or more variables and solve a derived problem from the second constraint problem based on the value used.

32. The computer program product of claim 29 wherein the second constraint problem includes a multi-stage problem.

33. The computer program product of claim 32 wherein the searching through the problem storage searches through stored constraint problems with similar levels of depth as the multi-stage problem.

34. The method of claim 6 wherein the verification process ensures that the semiconductor circuit matches a design specification.

35. The method of claim 1 wherein the first constraint problem related to the semiconductor circuit encapsulates an environment surrounding the semiconductor circuit.

36. The method of claim 6 wherein the verification process comprises generating numerous simulation problems comprising a plurality of parameters wherein the numerous simulation problems comprise the first constraint problem and the second constraint problem and the solving the first constraint problem and the second constraint problem includes providing stimulus for the semiconductor circuit.

* * * * *